United States Patent [19]

Crabbe et al.

[11] Patent Number: 5,352,912
[45] Date of Patent: Oct. 4, 1994

[54] GRADED BANDGAP SINGLE-CRYSTAL EMITTER HETEROJUNCTION BIPOLAR TRANSISTOR

[75] Inventors: Emmanuel F. Crabbe, Chappaqua; David L. Harame, Mohegan Lake; Bernard S. Meyerson, Yorktown Heights; Gary Patton, Poughkeepsie; Johannes M. C. Stork, Yorktown Heights, all of N.Y.

[73] Assignee: International Business Machines Corporation, Armonk, N.Y.

[21] Appl. No.: 792,493

[22] Filed: Nov. 13, 1991

[51] Int. Cl.$^5$ .................. H01L 29/161; H01L 29/72
[52] U.S. Cl. ................................... 257/198; 257/191; 257/197; 257/591; 257/616; 437/128; 437/131
[58] Field of Search ............... 357/16, 34; 437/128, 437/131; 257/191, 197, 198, 591, 616

[56] References Cited

U.S. PATENT DOCUMENTS

| | | | |
|---|---|---|---|
| 3,275,986 | 9/1966 | Matsukura et al. | 317/234 |
| 4,691,215 | 9/1987 | Luryi | 257/191 |
| 4,716,445 | 12/1987 | Sone | 257/198 |
| 4,768,074 | 8/1988 | Yoshida e al. | 357/34 |
| 4,771,326 | 9/1988 | Curran | 357/34 |
| 4,794,440 | 12/1988 | Capasso et al. | 357/34 |
| 4,959,702 | 9/1990 | Moyer et al. | 257/198 |
| 5,041,882 | 8/1991 | Katoh | 357/16 |
| 5,093,704 | 3/1992 | Saito et al. | 357/16 |
| 5,132,764 | 7/1992 | Bayraktaroglu | 257/592 |

FOREIGN PATENT DOCUMENTS

| | | |
|---|---|---|
| 0229672 | 7/1987 | European Pat. Off. ............. 29/72 |
| 0504875 | 9/1992 | European Pat. Off. |

OTHER PUBLICATIONS

Applied Physics Letters, vol. 53 #6, Aug. 1988 pp. 490–492 by Hayes et al.

H. Temkin, J. C. Bean, A. Antreasyan, and R. Leigbenguth, "Ge$_x$SI$_{1-x}$ Strained–Layer Heterostructure Bipolar Transistors", AT&T Bell Laboratories, Murray Hill, NJ 07974, accepted for Publication Jan. 29, 1988.

G. D. Shen, D X Xu, Willander, J. Knall, M-A Hasan and G. V. Hansson, "Novel Transport Phenomena in Si/Si$_{1-x}$GE$_x$/n-Si Double–Heterojunction Bipolar Transistors", Dept. of Physics, Linkoping University, S-581 83 Linkoping, Sweden, Accepted for Publication Jan. 20, 1989.

Gary L. Patton, James H. Comfort, Bernard S. Meyerson, Emmanuel F. Crabbé, Gerald J. Scilla, Edouard De Frésart, Johannes M. C. Stork, Jack Y.-C. Sun, David L. Harame, Joachim N. Burghartz, "75-GHzft SiGe–Base Heterojunction Bipolar Transistors", IEEE Electrical Device Letters, vol. 11, No. 4, Apr. 1990.

*Primary Examiner*—Mark V. Prenty
*Attorney, Agent, or Firm*—Heslin & Rothenberg

[57] ABSTRACT

A heterojunction bipolar transistor having a single-crystal emitter with reduced charge storage and acceptable current gain is described herein. The heterojunction transistor comprises a collector region, a base region formed on the collector region, and a single-crystal emitter region grown on the base region by low temperature epitaxy. During the formation of the base region, a graded profile of 5–23% germanium is added to the base, as the distance to the collector region decreases, thereby decreasing the base bandgap as it approaches the collector region. Further, during the formation of the emitter region, a graded profile of 0–20% germanium is added to the emitter as the distance from the emitter-base junction increases. Thus, the emitter bandgap decreases as it moves farther from the emitter-base junction. The result of the above grading profiles is that the emitter bandgap is narrower at the emitter contact than the base bandgap at the emitter-base junction.

18 Claims, 3 Drawing Sheets

GRADED BANDGAP SINGLE-CRYSTAL EMITTER HETEROJUNCTION BIPOLAR TRANSISTOR

TECHNICAL FIELD

The present invention relates to a heterojunction bipolar transistor, and more particularly to a bipolar transistor having a graded bandgap emitter region.

BACKGROUND ART

Bipolar transistors are important components in, for example, logic circuits, communications systems, and microwave devices. A bipolar transistor is essentially a three terminal device having three regions, an emitter, base and collector region, wherein the emitter and collector regions are of one conductivity type and the base is of another.

Since the advent of bipolar transistors, many attempts have been made to improve the performance of the transistor. Some of these attempts have focused on increasing the current gain by improving the injection efficiency of the minority carriers from the emitter to the base. In order to accomplish this, wide bandgap transistors have been fabricated wherein the bandgap of the emitter is wider than the bandgap of the base. The wide bandgap transistor has been described in many publications and patents, some of which include Herbert Kromer's "Theory of Wide Gap Emitter for Transistors" reported in The Proceedings of IRE, 1957, p. 1535; U.S. Pat. Nos. 2,569,347; and 4,716,445.

In U.S. Pat. No. 4,716,445 entitled "Heterojunction Bipolar Transistor Having A Base Region Of Germanium", and assigned to NEC Corporation, a wide bandgap heterojunction bipolar transistor is described. The transistor includes a collector region of gallium arsenide, a base region of germanium and an emitter region having a semiconductor layer of mixed crystal of silicon and germanium. The mixed crystal semiconductor layer may have a uniform distribution of silicon in germanium or a graded distribution of silicon. If the graded distribution is provided, the content of silicon increases with distance from the interface between the base and emitter regions. The silicon is added to the emitter region in order to increase the bandgap of the emitter region so that it is larger than the base bandgap. With the above described structure of a wide bandgap transistor and the fact that germanium has a large electron mobility, performance of the transistor is enhanced.

Many attempts in improving transistor performance have focused on, for example, decreasing the width of the base region of a transistor and decreasing the base transit time for a constant base width. In one example, in order to decrease both the base-width and the base transit time, a bipolar transistor having a graded silicon/germanium base is fabricated. The silicon/germanium base is epitaxially grown on an N-type collector, which is formed on a silicon substrate. Subsequently, the emitter region is formed on the base. In order to form the emitter, a window is opened and polysilicon is deposited. The polysilicon is heavily doped with an N-type dopant, such as arsenic. For example, the arsenic is implanted in the polysilicon and then a high temperature anneal cycle (e.g. 850° C. for 15 minutes) is used to diffuse the arsenic through the polysilicon, the polysilicon/silicon interface of the emitter and into the base. This process enables bases of approximately 600 Angstroms to be formed.

However, the above-described process places a limitation on how thin the bases can be fabricated. This limitation is due to the fact that the high temperature anneal cycle causes the P-type dopant, e.g. boron, in the base to diffuse thereby causing the base width to increase. Therefore, there is a limitation as to how thin the bases can be fabricated when the emitter is formed and contacted by polysilicon.

In order to fabricate transistors with thinner bases, it has been suggested to eliminate polysilicon emitter contacts and to use single-crystal emitters contacted by metal. A problem associated with single-crystal emitters, however, is that in order to obtain a reasonable current gain, the single-crystal emitter must have an emitter thickness greater than 300 Angstroms (for instance, 2000 Angstroms) and, therefore, the emitter charge storage is very large causing the device to be slow.

Accordingly, a need exists for a transistor having a single-crystal emitter with reduced charge storage. In addition, there still exists a need to increase device performance. Further, a need still exists to reduce the width of a base region in the device.

DISCLOSURE OF INVENTION

The shortcomings of the prior art are overcome and additional advantages are provided in accordance with the principles of the present invention through the provision of a heterojunction bipolar transistor having a graded emitter bandgap.

In accordance with the principles of the present invention, a heterojunction transistor having a first region of a first conductivity type, a second region of a second conductivity type formed on the first region and a third region of the first conductivity type formed on the second region is provided. The third region has a bandgap which decreases as the distance from the second region increases.

In one embodiment, a heterojunction bipolar transistor including a first region of a first conductivity type, a second region of a second conductivity type formed on the first region and a third region of the first conductivity type formed on the second region is provided. The third region has a contact and the second region and third region define a junction. The second and third regions have a first and second bandgap, respectively, wherein the second bandgap is narrower at the contact than the first bandgap at the junction.

In yet another aspect of the invention, a method for reducing charge storage in the emitter region of a bipolar transistor is provided. This method includes the step of grading the bandgap of the emitter region such that the bandgap decreases as the distance to the emitter contact decreases. In one particular embodiment, the grading of the emitter bandgap is accomplished by adding an increasing amount of germanium to the emitter region.

BRIEF DESCRIPTION OF DRAWINGS

The subject matter which is regarded as the invention is particularly pointed out and distinctly claimed in the claims at the conclusion of the specification. The invention, however, may best be understood by reference to the following detailed description taken in conjunction with the accompanying drawings in which:

BEST MODE FOR CARRYING OUT THE INVENTION

The fabrication of a heterojunction bipolar transistor having a single-crystal emitter is desirous, since a thinner base may be fabricated with such a design, thereby improving the cut-off frequency performance of the transistor. However, one disadvantage of the single-crystal emitter is that the thinner the emitter, the higher the base current and the lower the current gain. Thus, if, for example, and emitter is approximately 300 Angstroms or less, the base current is very large and the current gain is unacceptably low. (As is known, current gain=collector current÷base current. A preferable current gain is approximately 100). Therefore, in order to decrease the base current, a thick single-crystal emitter is formed, e.g. 2000 Angstroms. A thicker emitter leads to another problem, however, and that is increased emitter charge storage. As the charge storage increases, the cut-off frequency ($f_T$) decreases and, device performance is degraded. Thus, it is important to decrease the emitter charge storage in a single-crystal emitter. In accordance with the principles of the present invention, the emitter charge storage is decreased by grading the bandgap of the single-crystal emitter.

Figure 1:
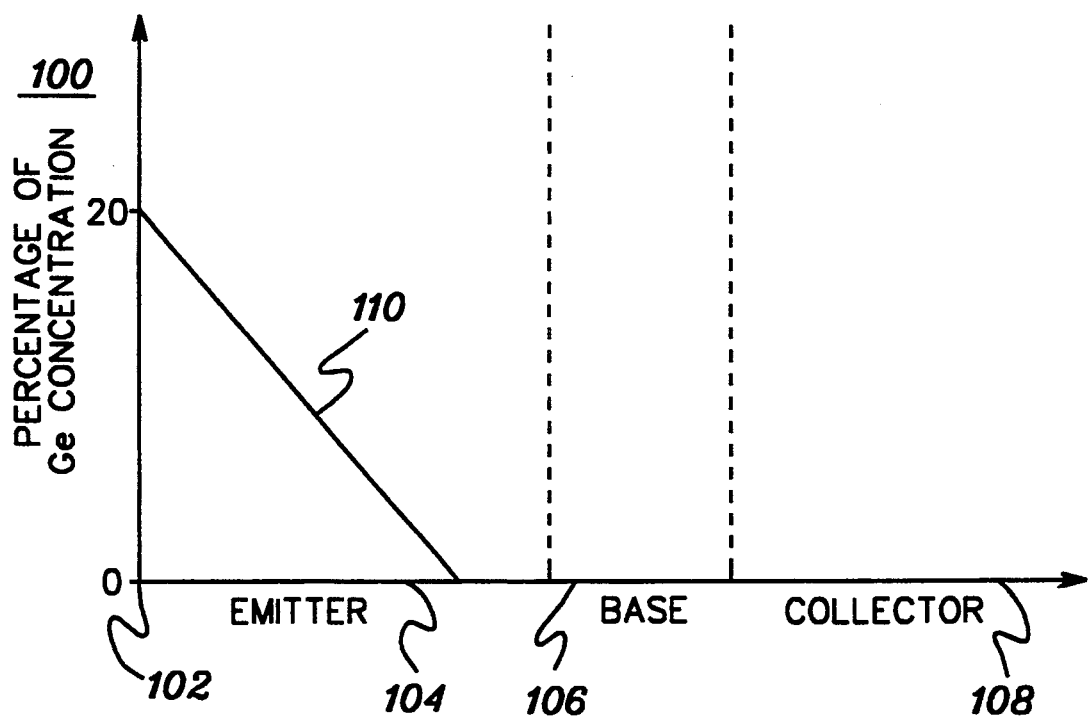
FIG. 1 represents one example of a graded germanium composition of the emitter profile, in accordance with the principles of the present invention.

Referring to FIG. 1, a schematic representation of a bipolar transistor 100 is illustrated. As is shown, the transistor includes an emitter contact 102, a single-crystal emitter region 104, a base region 106, and a collector region 108. (Each of these regions is known in the art. In addition, it is known in the art that there are quasi-neutral regions within the emitter and base region (not shown) and that there is virtually no electrostatic electric field in the quasi-neutral regions). In a preferred embodiment, emitter contact 102 is, for example, metal and emitter region 104 is approximately 2000 Angstroms thick and would be fabricated of a silicon/germanium alloy. In particular, in accordance with the principles of the present invention, the bandgap of the quasi-neutral region of emitter is graded using as one example, a germanium profile 110 illustrated in FIG. 1. In one example, the germanium profile starts at approximately 0% and increases to 20% as the distance from the base region increases. This bandgap grading results in a quasi-electric field which drives the minority carriers towards the emitter contact thereby decreasing emitter charge storage. However, when the germanium is added to the emitter region, the base current increases and thus, the current gain decreases to significantly below 80, thereby degrading device performance.

Figure 2:
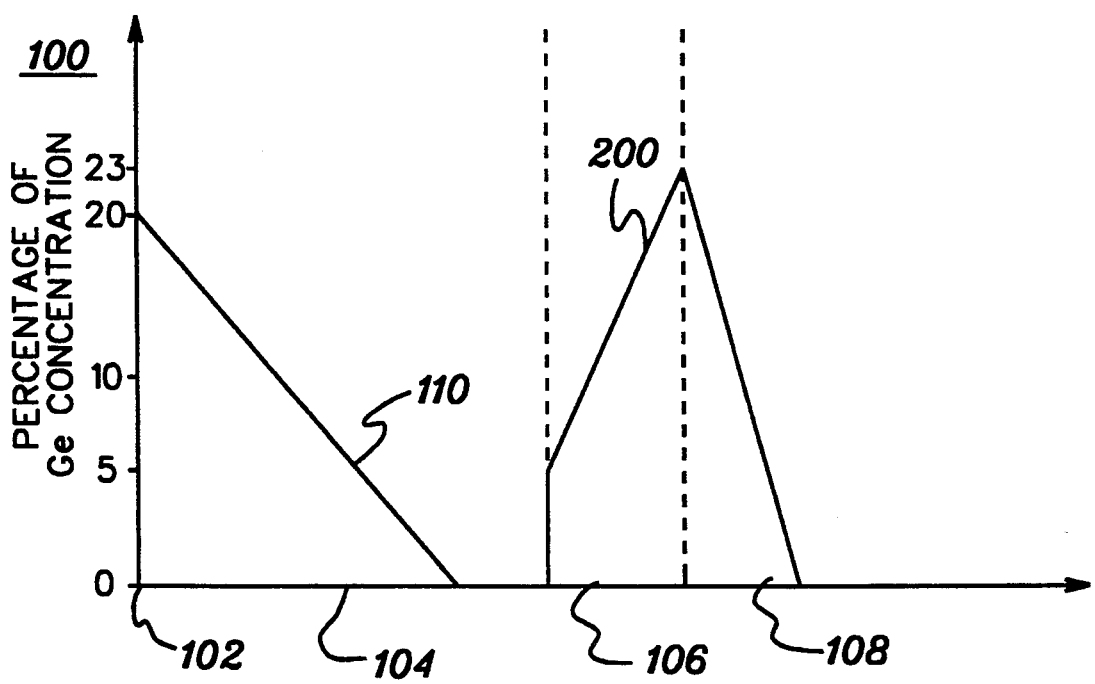
FIG. 2 illustrates one example of a graded germanium composition of the emitter profile and a graded germanium composition of the base profile, in accordance with the principles of the present invention.
Figure 3:
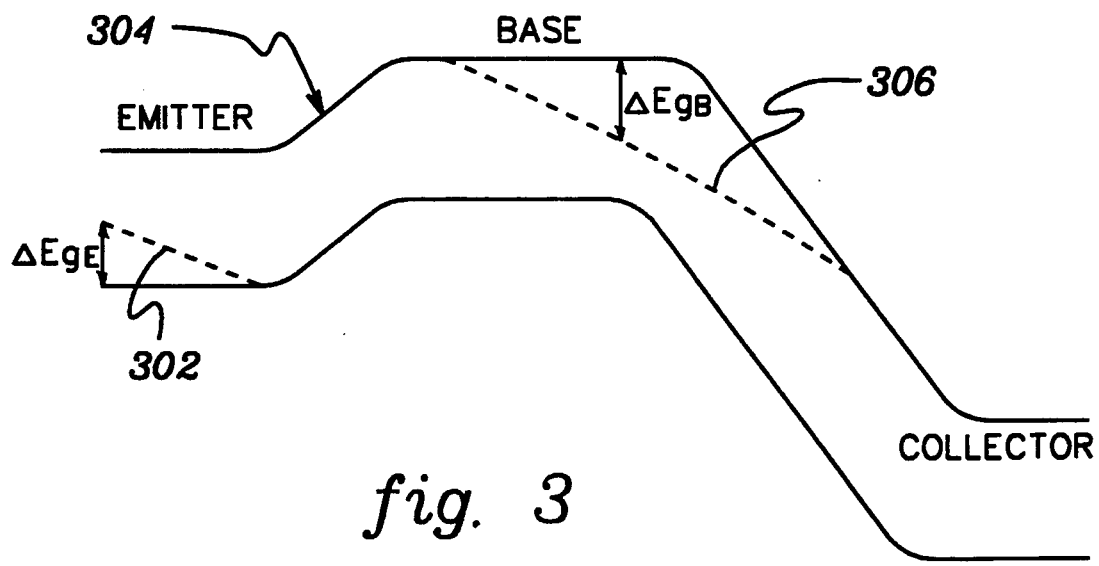
FIG. 3 depicts a graph showing emitter charge storage time and maximum cut-off frequency versus maximum germanium content in the 2000 Angstrom thick emitter region of a simulation run of the present invention for a transistor with a fixed current gain of 80.

In order to restore the current gain to an acceptable level (e.g. 80), germanium is also added to base region 106. In a preferred embodiment, the base is approximately 250 Angstroms and a graded profile of germanium 200 (FIG. 2) is added to the base. As illustrated in FIG. 2, in one example, the germanium profile in the base starts at approximately 5% and increases to 23% as the distance to the collector region decreases. The grading in the base advantageously increases the collector current at a given emitter-base voltage which increases the current gain. Thus, the grading profiles associated with the quasi-neutral region of the emitter and the base enable the current gain to remain at, for instance, approximately 80. In addition, by introducing a graded germanium profile in the emitter from 0–20% and a graded germanium profile in the base from 5–23%, simulations have shown, as depicted in FIG. 3, that the cut-off frequency is approximately 116 GHz, and the emitter charge storage time ($\tau e$) is approximately 0.23 psec. This is an increase in the cut-off frequency by a factor of 1.55 from the 75 GHz frequency achieved with no-germanium in the emitter and a 0–15% germanium graded base and the relative contribution of the emitter charge storage time to the cut-off frequency drops from 40% to 16% (note that in this simulation, the emitter was doped with arsenic at $1 \times 10^{19}$ cm$^{-3}$ and the base was 250 Angstroms with an intrinsic base sheet resistance of 10 kΩ/square).

Figure 4:
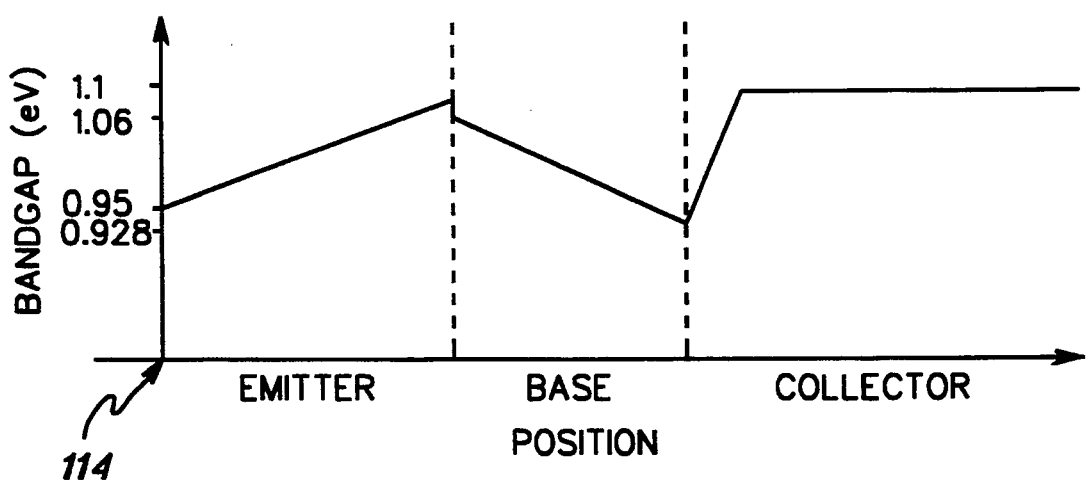
FIG. 4 is a band diagram for a transistor having the emitter bandgap profile and the base bandgap profile in accordance with the principles of the present invention.

Furthermore, as depicted in the band diagram of FIG. 4, as a result of placing a graded profile of germanium in the quasi-neutral region of the emitter, an emitter bandgap 402 decreases as the distance from an emitter-base junction 404 increases and the distance to the emitter contact 102 decreases. (As is known, Ec represents the conductance band and Ev represents the valence band.) In one example, the emitter bandgap is decreased by a value of 0.15 eV (electron volts), which is reflected in FIG. 4 as $\Delta E_{gE}$. This narrowing of the bandgap creates a quasi-electric field which sweeps the carriers towards the metal emitter contact 102, thereby reducing charge storage in the emitter. With this design, the minority carriers are forced out of the emitter. Furthermore, this bandgap narrowing possibly leads to a reduction in resistance of the metal contact, thus leading to lower emitter resistance. In addition, by grading the base as described above, a base bandgap 406 decreases as the distance from emitter-base junction 404 increases and the distance to the base-collector junction (not shown) decreases. In one example, the base bandgap is decreased by a value 0.17 eV, which is reflected as $\Delta E_{gB}$.

Figure 5:
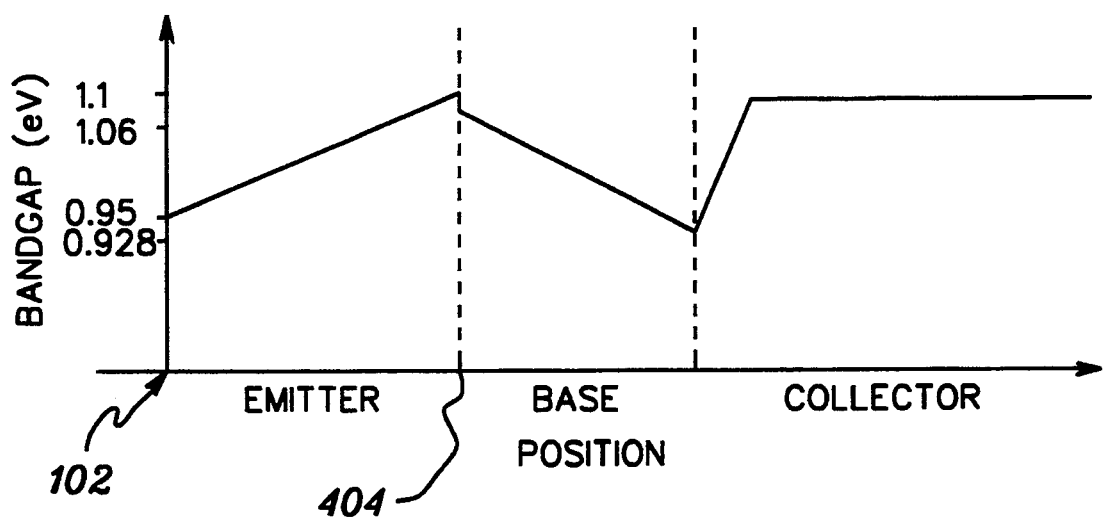
FIG. 5 is a bandgap versus position diagram for a transistor having graded silicon germanium emitter and base bandgap profiles in accordance with the present invention.

In accordance with the principles of the present invention, the bandgap of the emitter is narrower at the emitter contact than the bandgap of the base at the emitter-base junction 404. In one example, as depicted in FIG. 5, the emitter bandgap equals 0.95 eV at emitter contact 102, while the base bandgap at emitter-base junction 404 is 1.06 eV. Also, as depicted in FIG. 5, substantially proximate to emitter-base junction 404 there is a bandgap discontinuously of about 0.04 eV, which is determined by the bandgap of the emitter at the junction of 1.1 eV less the bandgap of the base at the junction of 1.06 eV. As described previously, the narrowing of the emitter bandgap is achieved, in accordance with the principles of the present invention, by grading the emitter bandgap with germanium. Some emitter bandgap narrowing caused by the grading of the dopant profile of the emitter may also occur. ( A reduction in bandgap with germanium incorporation in the silicon crystal is more effective however, and thus, preferred). This is accomplished by increasing the dopant concentration in the emitter as the distance to the emitter contact decreases. By using dopant grading in conjunction with bandgap grading, bandgap grading may be enhanced, especially when a high concentration of dopant is used.

Figure 6:
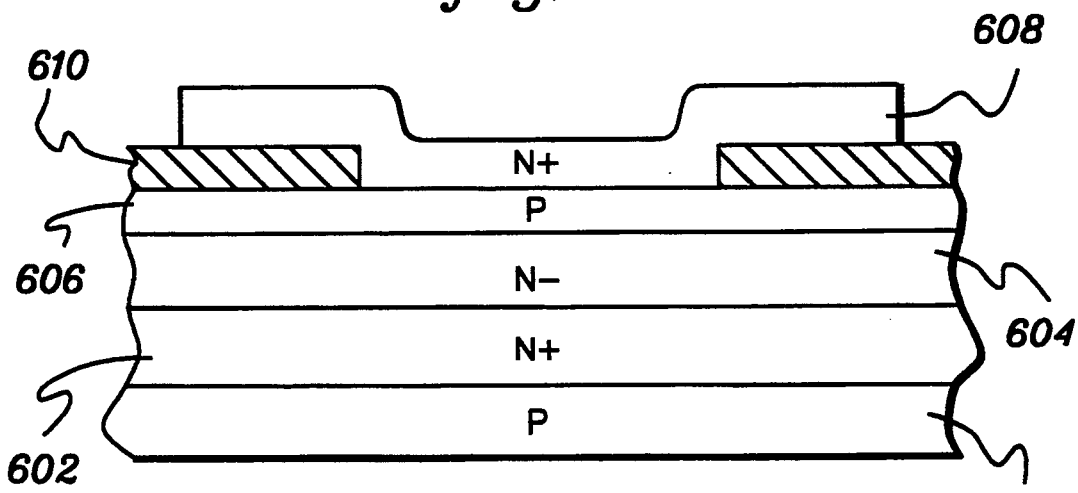
FIG. 6 is a cross-sectional view of an example of a transistor which may be structured according to the present invention.

One example of a device which could be structured in accordance with the principles of the present invention is depicted in FIG. 6. Referring to FIG. 6, on a silicon substrate 600 of P-type conductivity, an N+ silicon layer 602 is formed with a thickness of 10,000 Angstroms and is heavily doped with arsenic. On layer 602, an N-silicon layer 604 with a thickness of 4000 Angstroms and a $1 \times 10^{16}$ cm$^{-3}$ impurity concentration of arsenic is formed by epitaxy. The N+ silicon layer 602 and N-silicon layer 604 form the collector region 108 (FIG. 1). Once layer 604 is formed, deep trench isolation (not shown) between the devices is formed. Subsequently, a base region of P silicon/germanium layer 606 is formed by low temperature epitaxy such as MBE (Molecular Beam Epitaxy) or UHV/CVD (Ultra-High Vacuum/Chemical Vapor Deposition). The base has a final thickness of 250 Angstroms and a boron impurity concentration of typically $1 \times 10^{19}$ cm$^{-3}$. In accordance with the principles of the present invention, in a preferred embodiment, as the base is grown, an increasing amount of germanium is added to the silicon at selective points in the base. As one example, a grading profile of 5%–23% of germanium is added to the base wherein the amount of germanium increases as the distance to the collector region decreases. After the base is epitaxially grown, the emitter region is grown by defining an emitter window by known methods and then using low-temperature epitaxy to deposit an N+ silicon/germanium layer 608 having a thickness of 2000 Angstroms and an arsenic impurity concentration of $1 \times 10^{19}$ cm$^{-3}$. A material 610 is an insulator such as oxide, nitride, or composite stack.

Also, in accordance with the principles of the present invention, as the emitter region is formed, an increasing amount of germanium is added to the emitter. As one example, a grading profile of 0–20% of germanium is added to the emitter wherein the amount of germanium increases as the distance to the emitter contact decreases and the distance from the emitter-base junction increases. As previously described, by grading the base and emitter bandgaps in accordance with the principles of the present invention, device performance is significantly enhanced. While the structure of an N-P-N transistor is described herein, the invention is also applicable to P-N--P transistors. Very heavily doped emitters of silicon germanium P-N--P transistors can be grown by low-temperature epitaxy and the presence of germanium in the emitters counteracts the strain associated with the large concentration of boron atoms. It is apparent to those of ordinary skill in the art that the invention is not limited to the materials described herein, but that other materials may be used without departing from the spirit of the invention.

Figure 7:
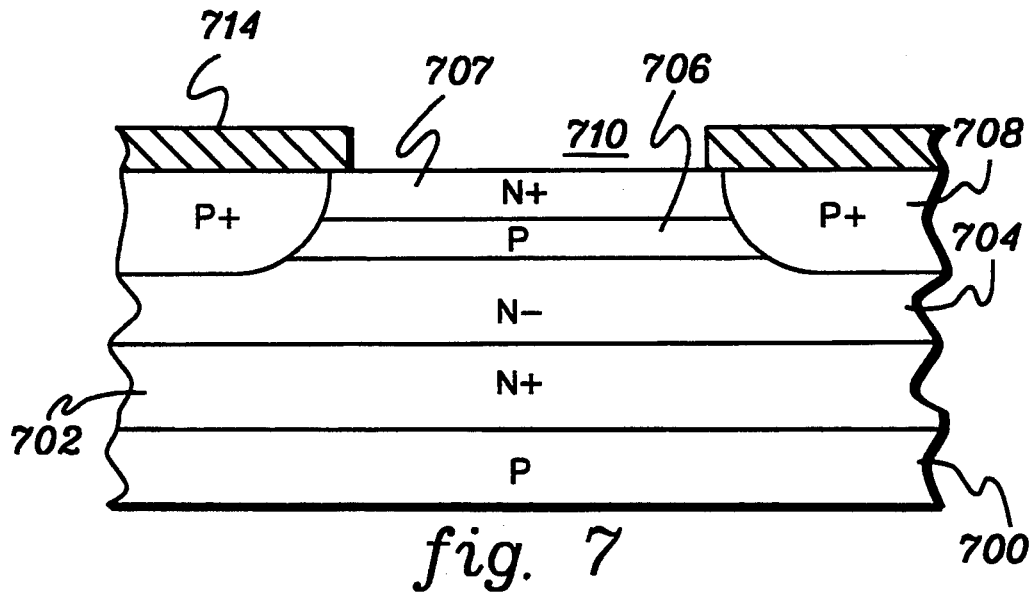
FIG. 7 is a cross-sectional view of another example of a transistor which may be structured according to the present invention.

Another example of a device structured in accordance with the principles of the present invention is depicted in FIG. 7. Referring to FIG. 7, on a P-type silicon substrate 700, a heavily doped (with e.g. arsenic) N+ silicon layer 702 having a thickness of typically 10,000 Angstroms is formed. On layer 702, an N-silicon layer 704 with a thickness of 4000 Angstroms and a $1 \times 10^{16}$ cm$^{-3}$ impurity concentration of arsenic is formed by epitaxy. Subsequently, a P-type base region of a silicon/germanium layer 706 is formed by low-temperature epitaxy. The base has a thickness of 250 Angstroms and a boron impurity concentration of $1 \times 10^{19}$ cm$^{-3}$. In accordance with the principles of the present invention, in a preferred embodiment, as the base is grown, an increasing amount of germanium is added to the silicon at selective points in the base. As one example, a grading profile of 5%–23% of germanium is added to the base wherein the amount of germanium increases as the distance to the collector region decreases. After the base is epitaxially grown, a single-crystal emitter having an N+ silicon/germanium alloy layer 707 having a thickness of 1000–2000 Angstroms and an impurity concentration of $5 \times 10^{18}$–$1 \times 10^{19}$ cm$^{-3}$ is formed thereon by low-temperature epitaxy. The electrical emitter dimensions are defined by an extrinsic P+ base 708 which is formed on either side of an emitter contact window 710. Thereafter, a contact window 710 is opened on top of emitter 707. The insulated layers 714 isolate the emitter contact from the extrinsic base.

Also, in accordance with the principles of the present invention, as the emitter region is formed, an increasing amount of germanium is added to the emitter. As one example, a grading profile of 0–20% of germanium is added to the emitter wherein the amount of germanium increases as the distance to the emitter contact decreases and the distance from the emitter-base junction increases. Once again, while an N-P-N silicon/germanium transistor is described, the invention is not limited to such a structure but can also be used with P-N-P silicon/germanium transistors and transistors of other materials.

As described previously, grading the emitter bandgap reduces current gain. Therefore, this grading profile may be used whenever the current gain needs to be decreased. For instance, as is known, if the current gain is too high (e.g. significantly greater than 100), then the breakdown voltage BVceo may decrease to unacceptable levels. Thus, the emitter bandgap grading profile of the present invention may be used to reduce current gain and establish an acceptable level for the breakdown voltage BVceo.

Although preferred embodiments have been depicted and described in detail herein, it will be apparent to those skilled in the relevant art that various modifications, additions, substitutions and the like can be made without departing from the spirit of the invention, and these are therefore considered to be within the scope of the invention as recited in the appended claims.

What is claimed is:

1. A heterojunction transistor comprising:
  a first region of a first conductivity type;
  a second region of a second conductivity type formed on said first region;
  a third region of said first conductivity type formed on said second region, said third region having a bandgap which progressively decreases as the distance from said second region increases, said bandgap being narrower at all points within said third region than at a junction between said second and third regions;

wherein said first conductivity type is N-type and said second conductivity type is P-type; and wherein said first region is a collector region, said second region is a base region and said third region is an emitter region and wherein said emitter region contains a field-free region of silicon remote from a junction between said second and third regions.

2. The heterojunction transistor of claim 1, wherein an increasing amount of germanium is added to said field-free emitter region so that said bandgap decreases as the distance from said second region increases.

3. The heterojunction transistor of claim 2, wherein the amount of said germanium increases from 0% to 20%.

4. A heterojunction bipolar transistor comprising:
a first region of n-doped silicon or silicon-germanium;
a second region of p-doped silicon or silicon-germanium formed on said first region, said second region having a first bandgap; and
a third region of n-doped silicon or silicon-germanium formed on said second region, said second region and said third region defining a junction, said third region having a contact formed thereon and a second bandgap, said second bandgap being narrower at said contact than said first bandgap at said junction.

5. The heterojunction transistor of claim 4, wherein said first region is a collector region, said second region is a base region and said third region is an emitter region and wherein said emitter region contains a field-free region of silicon or silicon-germanium remote from a junction between said second and third regions.

6. The heterojunction transistor of claim 5, wherein said second bandgap is graded.

7. The heterojunction transistor of claim 6, wherein an increasing amount of germanium is added to said field-free emitter region in order to decrease said second bandgap as the distance to said contact decreases.

8. The heterojunction transistor of claim 7, wherein the amount of said germanium increases from 0% to 20%.

9. The heterojunction transistor of claim 8, wherein said first bandgap is graded.

10. The heterojunction transistor of claim 9, wherein an increasing amount of germanium is added to said second region such that said first bandgap decreases as the distance to said first region decreases.

11. The heterojunction transistor of claim 10, wherein the amount of said germanium increases from 5% germanium to 23% germanium.

12. The heterojunction transistor of claim 11, wherein said third region has a thickness greater than 300 Angstroms.

13. In a method of fabricating a bipolar transistor having a single-crystal emitter region including an emitter contact, a base region, and a collector region, the improvement comprising:
the step of grading a bandgap in said emitter region such that said bandgap decreases as the distance to said emitter contact decreases, whereby charge storage in said emitter region is reduced, said bandgap being narrower at all points within said emitter region than at a junction between said base and emitter regions; and
wherein said grading step includes adding an increasing amount of germanium to said emitter region as the distance to said emitter contact decreases; and
wherein the amount of said germanium increases from 0% to 20% as the distance to said contact decreases.

14. A heterojunction transistor, comprising:
a first region of a first conductivity type;
a second region of a second conductivity type formed on said first region;
a third region of said first conductivity type formed on said second region, said third region having a bandgap which decreases as the distance from said second region increases, said bandgap being narrower at all points within said third region than at a junction between said second and third regions, and said second and third regions having a bandgap discontinuity substantially proximate to said junction of between about 0 to 0.04 eV.

15. The heterojunction transistor of claim 14, wherein said first conductivity type is N-type and said second conductivity type is P-type.

16. In a method of fabricating a bipolar transistor having a single-crystal emitter region including an emitter contact, a base region, and a collector region, the improvement comprising the step of grading a bandgap in said emitter region such that said bandgap decreases as the distance to said emitter contact decreases, whereby charge storage in said emitter region is reduced, said bandgap being narrower at all points within said emitter region than at a junction between said base and emitter regions, and said emitter and base regions having a bandgap discontinuity substantially proximate to said junction of between about 0 to 0.04 eV.

17. The method of claim 16 wherein said grading step includes adding an increasing amount of germanium to said emitter region as the distance to said emitter contact decreases.

18. The method of claim 17 wherein the amount of said germanium increases from 0% to 20% as the distance to said contact decreases.

* * * * *